US012769210B2

(12) United States Patent
Chou

(10) Patent No.: US 12,769,210 B2
(45) Date of Patent: Oct. 20, 2026

(54) LIGHT-CURED ANTI-SLIP STRUCTURE OF SHOE SOLE MANUFACTURING METHOD

(71) Applicant: FENG TAY ENTERPRISES CO., LTD., Yunlin County (TW)

(72) Inventor: Chien-Hsin Chou, Yunlin County (TW)

(73) Assignee: FENG TAY ENTERPRISES CO., LTD., Yunlin County (TW)

( * ) Notice: Subject to any disclaimer, the term of this patent is extended or adjusted under 35 U.S.C. 154(b) by 135 days.

(21) Appl. No.: 18/886,966

(22) Filed: Sep. 16, 2024

(65) Prior Publication Data

US 2025/0004379 A1 Jan. 2, 2025

Related U.S. Application Data

(62) Division of application No. 17/388,348, filed on Jul. 29, 2021, now abandoned.

(51) Int. Cl.

| | |
|---|---|
| ***G03F 7/20*** | (2006.01) |
| ***A43B 13/22*** | (2006.01) |
| ***B32B 3/30*** | (2006.01) |
| ***B32B 25/14*** | (2006.01) |
| ***C08L 35/02*** | (2006.01) |

(52) U.S. Cl.

CPC ................ *G03F 7/20* (2013.01); *A43B 13/22* (2013.01); *B32B 3/30* (2013.01); *B32B 25/14* (2013.01); *C08L 35/02* (2013.01); *B32B 2437/02* (2013.01)

(58) Field of Classification Search

CPC .. G03F 7/20; A43B 13/22; B32B 3/30; B32B 25/14; C08L 35/02

See application file for complete search history.

(56) References Cited

FOREIGN PATENT DOCUMENTS

JP 2017145583 * 8/2017

* cited by examiner

*Primary Examiner* — Nathan T Leong

(74) *Attorney, Agent, or Firm* — Apex Juris, pllc; Cera Oh

(57) ABSTRACT

A light-cured anti-slip structure includes an anti-slip layer fixed onto a substrate surface. The anti-slip layer is composed of the light-curing composite, wherein the light-curing composite includes 50 wt % to 100 wt % of photopolymer, 0.5 wt % to 20 wt % of photoinitiator, 5 wt % to 50 wt % of thermosetting polymer, less than or equal to 5 wt % of thermal curing initiator, which are mixed. The photoinitiator receives light energy to trigger a light-curing reaction of the photopolymer. Simultaneously the photoinitiator releases heat to activate the thermal curing initiator, the thermal curing initiator induces a curing reaction of the thermosetting polymer to form the anti-slip layer. The light-cured anti-slip structure provided by the present invention could be quickly cured on the substrate surface, and the manufacturing time and the cost of material could be significantly reduced. A manufacturing method of a light-cured anti-slip structure is provided as well.

9 Claims, 5 Drawing Sheets

LIGHT-CURED ANTI-SLIP STRUCTURE OF SHOE SOLE MANUFACTURING METHOD

BACKGROUND OF THE INVENTION

Technical Field

The present invention relates generally to a light-cured anti-slip structure of a shoe sole, and more particularly to a light-cured anti-slip structure of a shoe sole manufacturing method.

Description of Related Art

As the technology develops, a range of applications of a lightweight product made of foam material is wider and wider. For example, toys, daily commodities, and sporting goods could be made of the foam material to lighten weight of products. Take the sporting goods as an example, a helmet lining, a protective apparatus, a shoe midsole, and components that are made of composite material could be made of the foam material.

However, an ability of anti-slip of the foam material is worse, so that when the products need to have the ability of anti-slip, the foam material cannot be a contact member that is directly exposed outside. So far, to solve the above problem, a base material made of the rubber is attached to the outer surface of the foam material, so that the products made of foam material could have the ability of anti-slip.

The base material made of the rubber is a thermosetting material, wherein a heating step under strict temperature control is necessary to complete a thermal curing reaction of the rubber, so that the manufacturing method of a base material made of the rubber consumes a great amount of time and material. On the other hand, the product made of foam material with the base material made of the rubber needs adhesive to adhere the rubber base material to the outer surface of the foam material. Moreover, when adhesive is aged, the rubber base material may fall from the surface of the foam material, so that the durability and the reliability of such anti-slip product are still weak.

Additionally, the product made of the foam material with the rubber base material utilizes the adhesive to fix the rubber base material to the outer surface of the foam material to provide the ability of anti-slip. Since the rubber base material has a thickness that is unable to be ignored, and the adhesive has a thickness as well, the thickness of the product with the ability of anti-slip cannot be reduced.

In conclusion, there is a need to develop a new light-cured anti-slip structure and a manufacturing method thereof, to produce an anti-slip product with a simple structure and lighter weight and to effectively promote production efficiency, reliability, and durability.

BRIEF SUMMARY OF THE INVENTION

In view of the above, the primary objective of the present invention is to provide a light-cured anti-slip structure including a light-curing composite, wherein the light-curing composite includes a photopolymer, a photoinitiator, a thermosetting polymer, and a thermal curing initiator, which are mixed. During a radiating step, a light-curing reaction of light-curing composite could be induced, and an exothermic reaction is accompanied by the light-curing reaction to induce the thermal curing reaction. Therefore, by simply applying the light-curing composite in liquid on the substrate surface and radiating the light-curing composite, an anti-slip layer which is light and thin could be made. Comparing the light-cured anti-slip structure with the manufacture of the conventional product made of the foam material with rubber base material, the manufacturing time of an anti-slip structure is greatly shortened, thereby enhancing production efficiency, reliability, and durability. Additionally, since the anti-slip layer formed by radiating the light-curing composite is directly attached to the substrate surface, there is no medium or adhesive located between the anti-slip layer and the substrate surface.

The present invention provides a light-cured anti-slip structure including an anti-slip layer which is fixed on a surface of a substrate and is composed of a light-curing composite. The light-curing composite includes a photopolymer, a photoinitiator, a thermosetting polymer, and a thermal curing initiator. The photopolymer is greater than or equal to 50 wt % and is less than 100 wt % based on a weight of the light-curing composite. The photoinitiator is greater than or equal to 0.5 wt % and is less than or equal to 20 wt % based on the weight of the light-curing composite. The thermosetting polymer is greater than or equal to 5 wt % and is less than or equal to 50 wt % based on the weight of the light-curing composite. The thermal curing initiator is less than or equal to 5 wt % and is not equal to 0 wt % based on the weight of the light-curing composite. A sum of weight percentages of the photopolymer, the photoinitiator, the thermosetting polymer, and the thermal curing initiator is equal to 100 wt %. The photopolymer, the photoinitiator, the thermosetting polymer, and the thermal curing initiator are mixed to form the light-curing composite. The photoinitiator receives a light energy to induce a light-curing reaction of the photopolymer. Simultaneously, the photoinitiator releases heat to activate the thermal curing initiator, and the thermal curing initiator induces a curing reaction of the thermosetting polymer, thereby forming the anti-slip layer.

In addition, the another primary objective of the present invention is to provide a manufacturing method of a light-cured anti-slip structure of a shoe sole at least including the following steps. Provide the light-curing composite, wherein the light-curing composite comprises the photopolymer, the photoinitiator, the thermosetting polymer, and the thermal curing initiator, which are mixed. Apply the light-curing composite on the surface of the substrate. Provide the light energy for radiating the light-curing composite; the photoinitiator receives the light energy to induce the light-curing reaction of the photopolymer. Simultaneously, the photoinitiator releases heat to activate the thermal curing initiator to induce the curing reaction of the thermosetting polymer, thereby forming the anti-slip layer on the surface of the substrate.

In addition, the another primary objective of the present invention is to provide the light-cured anti-slip structure which is manufactured by the manufacturing method of the light-cured anti-slip structure.

With the aforementioned design, the light-cured anti-slip structure includes the light-curing composite, wherein the light-curing composite includes the photopolymer, the photoinitiator, the thermosetting polymer, and the thermal curing initiator which are mixed. By simply apply the light-curing composite in liquid on the substrate surface and utilize the radiating step to induce the light-curing reaction and the thermal curing reaction of the light-curing composite, the anti-slip product with the anti-slip layer could easily be made. Comparing to the conventional foam material with the rubber base material, the manufacturing time of manufacture the light-cured anti-slip structure is significantly shortened, and the reliability and the durability of the product are enhanced. Additionally, since the anti-slip layer formed by radiating the light-curing composite is directly fixed onto the substrate surface, so that there is no medium or adhesive between the anti-slip layer and the substrate surface.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
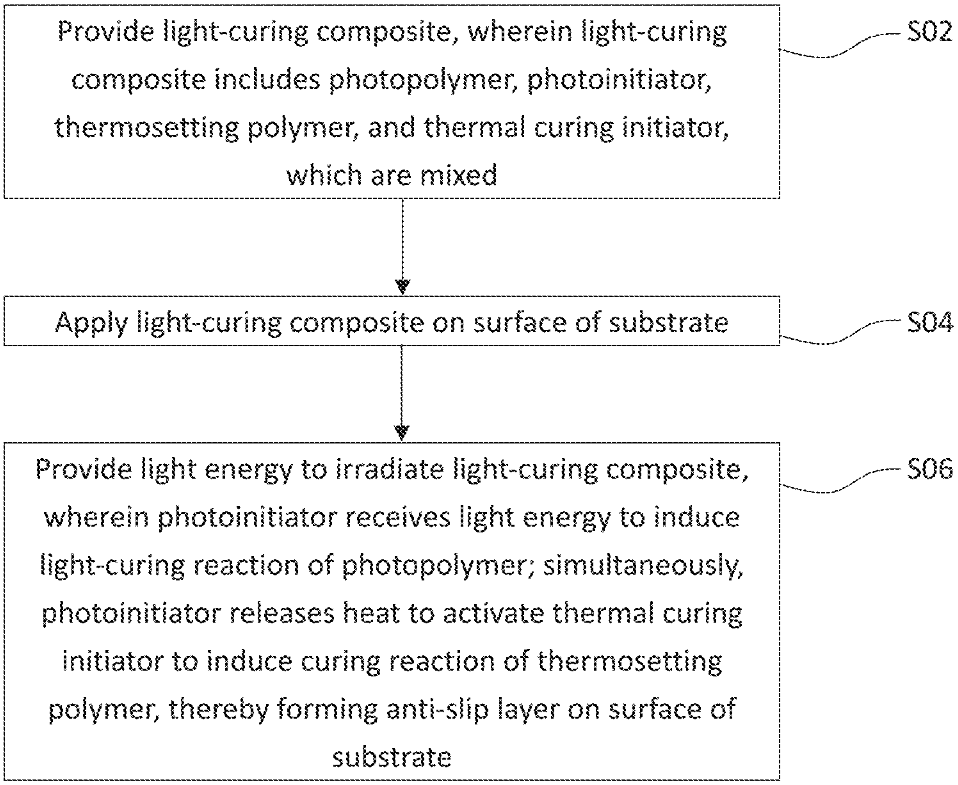
FIG. 1 is a flowchart, showing the manufacturing method of the light-cured anti-slip structure of a shoe sole of an embodiment according to the present invention.
Figure 2:
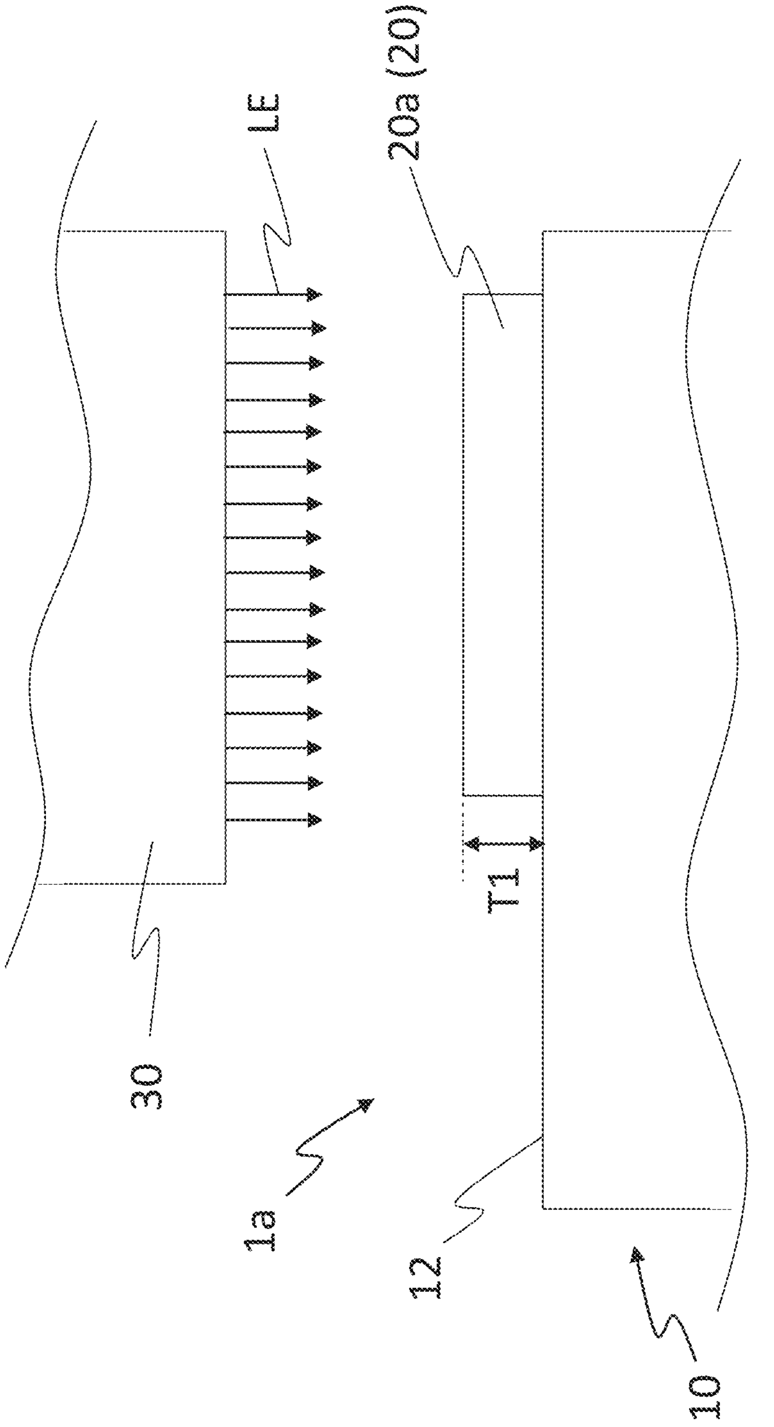
FIG. 2 is a schematic diagram, showing the manufacturing method of the light-cured anti-slip structure of a shoe sole of the embodiment according to the present invention.
Figure 3:
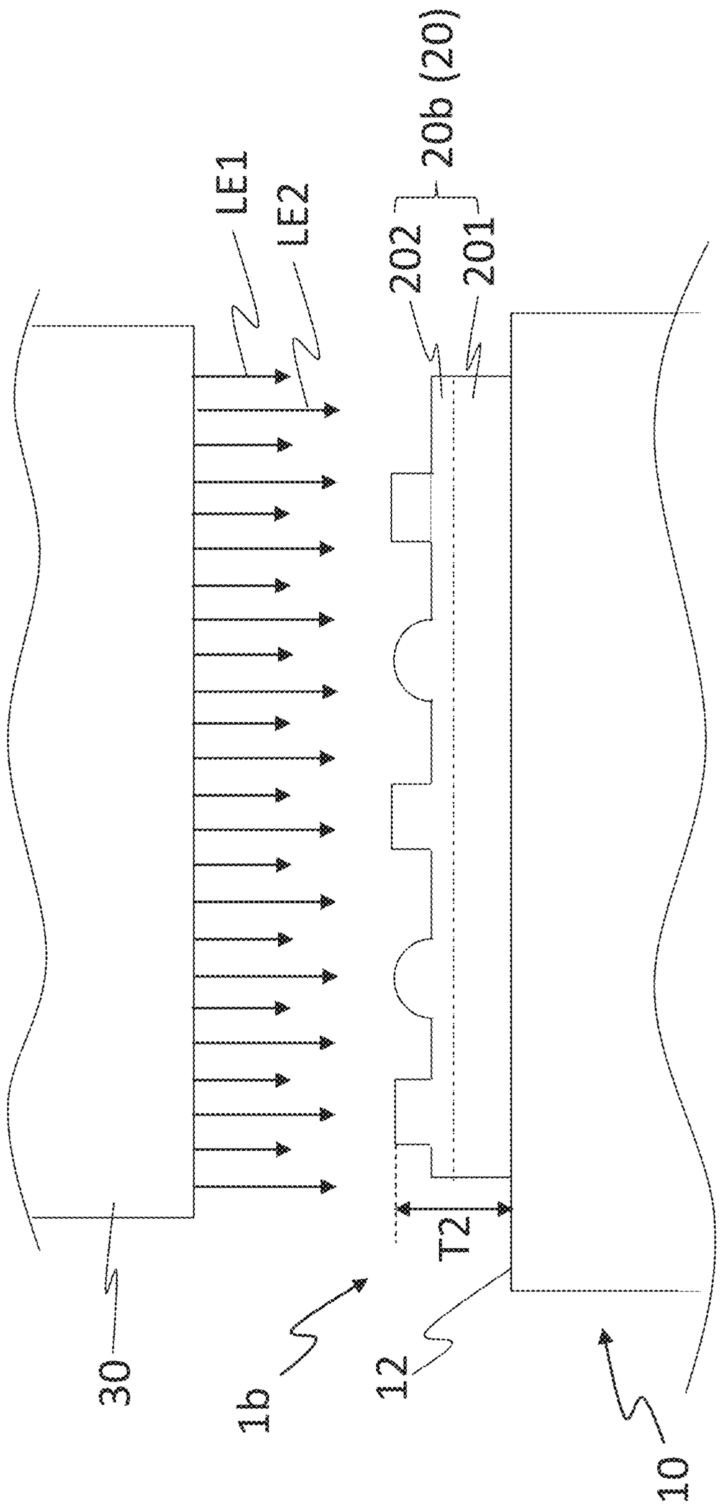
FIG. 3 is a schematic diagram, showing the manufacturing method of the light-cured anti-slip structure of a shoe sole of another embodiment according to the present invention.

Referring to FIG. 1 to FIG. 3, FIG. 1 is a flowchart showing a manufacturing method of a light-cured anti-slip structure of a shoe sole of an embodiment according to the present invention; FIG. 2 is a schematic diagram showing the manufacturing method of the light-cured anti-slip structure of the shoe sole 1_a_ of an embodiment according to the present invention; FIG. 3 is a schematic diagram showing the manufacturing method of the light-cured anti-slip structure of the shoe sole 1_b_ of an embodiment according to the present invention.

As illustrated in FIG. 1, the manufacturing method of the light-cured anti-slip structure of the shoe sole 1_a_, 1_b_ includes at least the following steps:

Step S02: provide a light-curing composite 20, wherein the light-curing composite 20 includes a photopolymer, a photoinitiator, a thermosetting polymer, and a thermal curing initiator, which are mixed;

Step S04: apply the light-curing composite 20 on a surface 12 of a substrate 10; and Step S06: provide a light energy LE for irradiating the light-curing composite 20, wherein the photoinitiator receives the light energy LE, LE1, LE2 to induce a light-curing reaction (namely a polymerization or a cross-link) of the photopolymer. At the same time, the photoinitiator releases heat to activate the thermal curing initiator to induce a curing reaction (namely a polymerization or a cross-link) of the thermosetting polymer, thereby forming an anti-slip layer 20_a_ on the surface 12 of the substrate 10. In the current embodiment, the light-curing reaction and the thermal curing reaction in the step S06 do not need to be activated by an additional heating process. In other words, the thermal curing reaction is entirely induced by a heat energy released from an exothermic reaction of the light-curing reaction.

In an embodiment, the light-curing composite includes the photopolymer which is greater than or equal to 50 wt % and is less than 100 wt % based on a weight of the light-curing composite, the photoinitiator which is greater than or equal to 0.5 wt % and is less than or equal to 20 wt % based on the weight of the light-curing composite, the thermosetting polymer which is greater than or equal to 5 wt % and is less than or equal to 50 wt % based on the weight of the light-curing composite, and the thermal curing initiator which is less than or equal to 5 wt % and is not equal to 0 wt % based on the weight of the light-curing composite. A sum of weight percentages of the photopolymer, the photoinitiator, the thermosetting polymer, and the thermal curing initiator is equal to 100 wt %

In the step S02, the photopolymer is constituted of at least one type of acrylate monomers which have at least one double bond, wherein the acrylate monomers could have, but not limited to, a urethane group, an epoxy group, an amine group, a polyester group or the combination thereof. In the current embodiment, photopolymer is selected one of a group of component, consisting of full acrylate resin, 2-phenoxy ethyl acrylate, polyethylene glycol (600) dimethacrylate, ditrimethylolpropane tetraacylate, aliphatic urethane acrylate, aromatic urethane acrylate, modified bisphenol A epoxy diacrylate, amine-modified polyether acrylate, polyester acrylate, and a combination thereof.

The photoinitiator is selected from a group of components consisting of benzophenone, phosphine oxide, quinone, titanocene, and a combination thereof. For example, the benzophenone photoinitiator could be, but not limited to, 2-Hydroxy-2-methylpropiophenone, methylbenzoyl formate, 1-hydroxycyclohexyl phenyl ketone, or a combination thereof; the phosphine oxide photoinitiator could be, but not limited to, diphenyl-(2,4,6-trimethylbenzoyl)-phosphine oxide, bis(2,4,6-trimethylbenzoyl)-phenylphosphine oxide, or a combination thereof; the quinone photoinitiator could be, but not limited to DL-camphorquinone; the titanocene photoinitiator could be, but not limited to bis(η5-cyclopentadienyl)-bis(2,6-difluoro-3-[pyrrol-1-yl]-phenyl)titanium.

In the current embodiment, a light that could be absorbed by the said photoinitiators includes UV radiation and/or visible light, wherein a wavelength of a light that could be absorbed by each of the photoinitiators mentioned above is listed as below:

2-hydroxy-2-methylpropiophenone could absorb a light in a wavelength range of 246 nm to 333 nm.

Methylbenzoyl formate could absorb a light in a wavelength range of 255 nm to 325 nm. 1-Hydroxycyclohexyl phenyl ketone could absorb a light in a wavelength range of 245 nm to 331 nm.

Diphenyl-(2,4,6-trimethylbenzoyl)-phosphine oxide could absorb a light in a wavelength range of 295 nm to 393 nm.

Bis(2,4,6-trimethylbenzoyl)-phenylphosphine oxide could absorb a light in a wavelength range of 295 nm to 370 nm.

DL-camphorquinone could absorb a light at a wavelength of 470 nm.

Bis(η5-cyclopentadienyl)-bis(2,6-difluoro-3-[pyrrol-1-yl]-phenyl) titanium could absorb a light in a wavelength range of 398 nm to 470 nm.

In the step S06, the light energy is provided by a light in a wavelength range of 100 nm to 600 nm. A time of irradiation is arranged from 1 second to 60 seconds A power of the light energy is arranged from 0.1 J/cm$^2$ to 10 J/cm$^2$. As illustrated in FIG. 2 and FIG. 3, the light energy LE, LE1, LE2 is produced by a light-curing apparatus 30.

The thermosetting polymer is selected from a group of components consisting of rubber material, urethane, epoxy, and a combination thereof. However, the thermosetting polymer is not limited to the above-mentioned material. In the current embodiment, the rubber material needs to be flowable, so that the rubber material could be liquid rubber, rubber monomer, dissolved rubber, or a combination thereof, wherein the dissolved rubber is a rubber that dissolved by a solvent, so that the rubber that is in liquid form could be evenly mixed with the photopolymer in liquid form. It is worthy to mention that any rubber material that is in liquid form is suitable to be used.

The thermal curing initiator includes peroxide, which is selected from a group consisting of benzoyl peroxide (BPO), dicumyl peroxide (DCP), di-t-butyl peroxide (DTBP), 1,1-bis(tert-butylperoxy)-3,3,5 trimethylcyclohexane peroxide (TMCH), bis(t-butylperoxy Isopropyl) benzene peroxide (BIPB), or a combination thereof. However, the peroxide which could be used as the thermal curing initiator is not limited to the aforementioned substances.

In the step S06, there are the light-curing reaction and the thermal curing reaction without a need of additional heating processes. In other words, the thermal curing reaction is entirely induced by a heat energy released from an exothermic reaction of the light-curing reaction. More specifically, after the photoinitiator is adapted to absorb the light energy LE, LE1, LE2 to release heat, a temperature of the light-curing composite is increased to an exothermic temperature. The thermal curing initiator is activated at an initiating temperature. When the exothermic temperature is greater than or equal to the initiating temperature, the thermal curing initiator is activated to induce the curing reaction of the thermosetting polymer. In the current embodiment, during a photo-curing process, the exothermic temperature of the photoinitiator is greater than or equal to 60 degrees Celsius. The initiating temperature of the thermal curing initiator is greater than or equal to 60 degrees Celsius, wherein the initiating temperature of the thermal curing initiator is smaller than or equal to the exothermic temperature of the photoinitiator.

In FIG. 2, the anti-slip layer 20*a* has a maximum thickness T1 which is smaller than or equal to 3 mm. Preferably, the maximum thickness T1 is smaller than or equal to 0.1 mm. In the current embodiment, the maximum thickness T1 of the anti-slip layer 20*a* could be smaller than or equal to 0.1 mm. The conventional rubber anti-slip material adhered to a bottom of a product cannot be as thin as the anti-slip layer 20*a* of the present invention.

In FIG. 3, the anti-slip layer 20*b* has a maximum thickness T2, which is smaller than or equal to 3 mm and is greater than or equal to 0.3 mm. In the current embodiment, the maximum thickness of the anti-slip layer 20*b* is greater than or equal to 0.3 mm, so that the anti-slip layer 20*b* is hard to be fully cured by radiating with a light energy at a single wavelength. More specifically, the anti-slip layer 20*b* is defined to have an inner layer 201 and an outer layer 202 that is disposed on the inner layer 201. Therefore, when using the light energy LE1 with a shorter wavelength (ranged between 100 nm and 320 nm) to induce the photo-curing, the outer layer 202 is cured earlier than the inner layer 201, because a penetration depth of the light energy LE1 with the shorter wavelength is shorter. In other words, when the outer layer 202 is cured completely, the inner layer 201 has not been completely cured yet. On contrary, when using the light energy LE2 with a longer wavelength (ranged between 280 nm and 400 nm) to induce the photo-curing, the inner layer 201 is cured earlier than the outer layer 202, because a penetration depth of the light energy LE2 with the longer wavelength is longer. In other words, when the inner layer 201 is fully cured, the outer layer 202 has not been fully cured yet.

As illustrated in FIG. 3, in the current embodiment, the light energy includes the light energy LE1 within a first wavelength range and the light energy LE2 within a second wavelength range, wherein the first wavelength range is from 280 nm to 600 nm, and the second wavelength range is from 100 nm to 400 nm. The light energy LE1 within the first wavelength range is adapted to induce the photopolymer of the inner layer 201 to be cured, and the light energy LE2 within the second wavelength range is adapted to induce the photopolymer of the outer layer 202 to be cured.

Figure 4A:
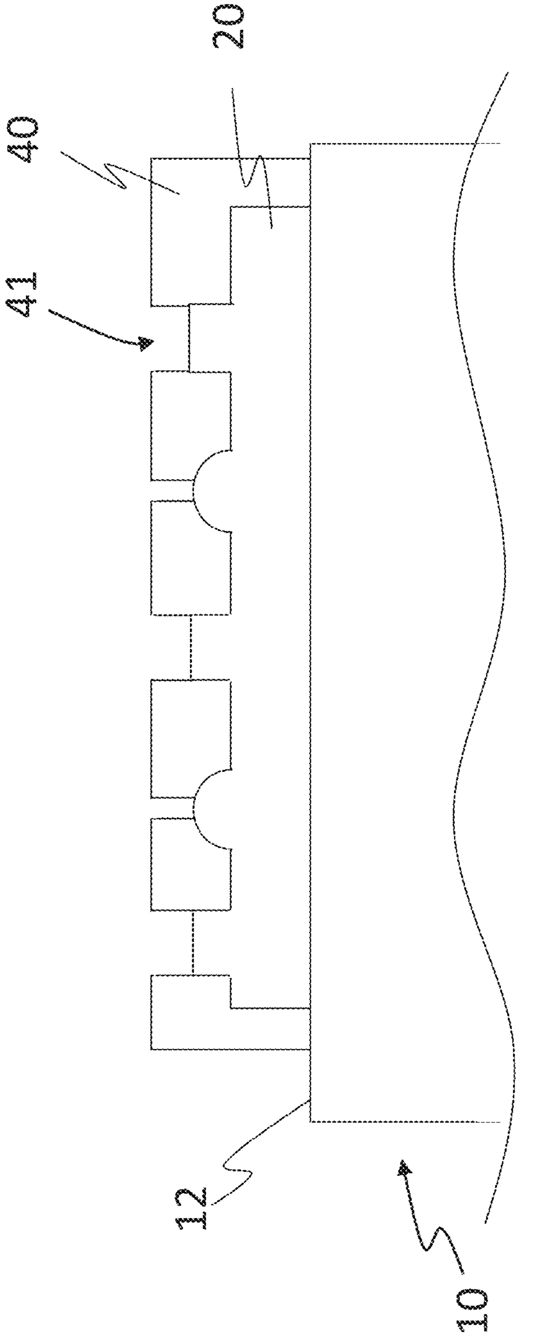
FIG. 4A is a schematic diagram, showing the manufacturing method of the light-cured anti-slip structure of a shoe sole of the another embodiment according to the present invention.
Figure 4B:
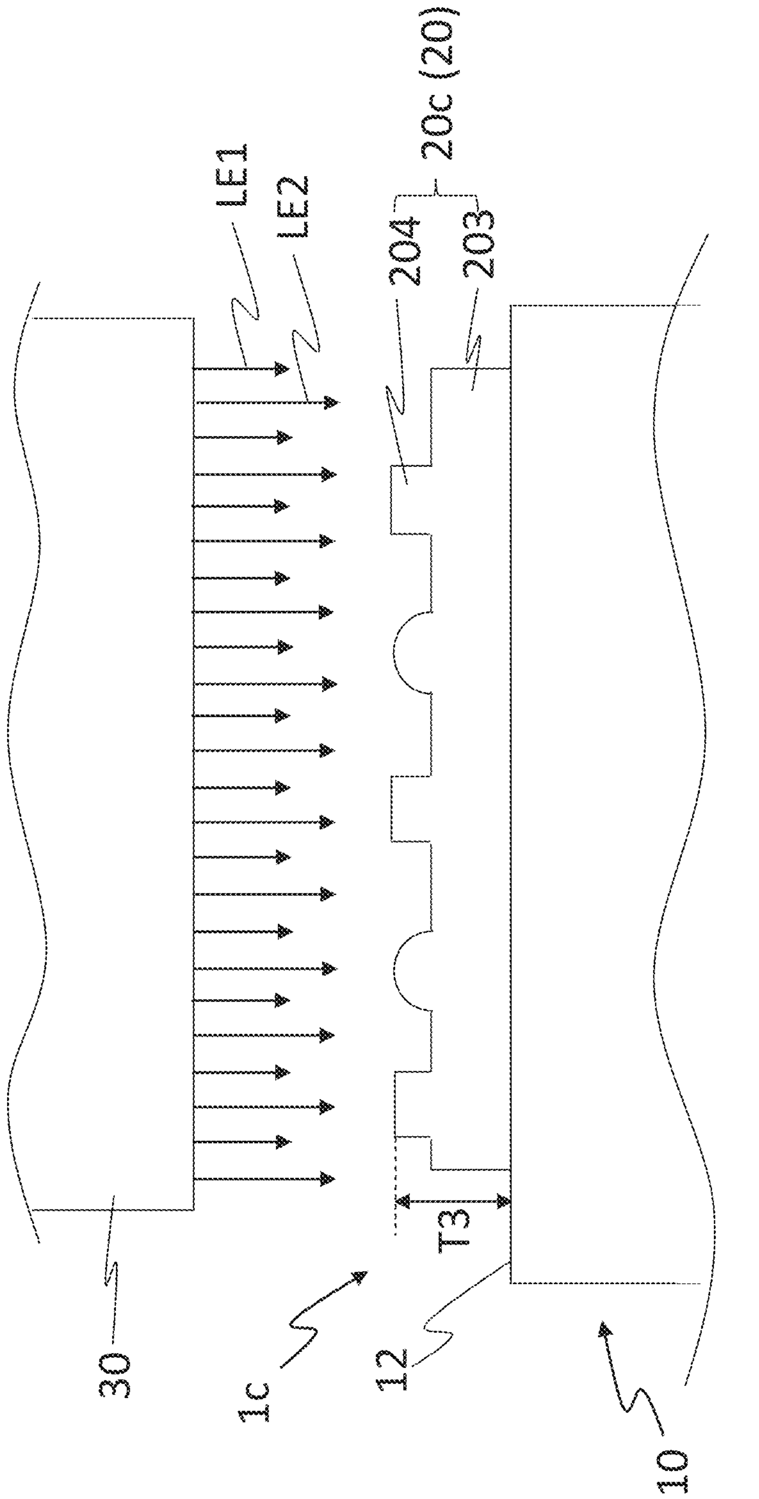
FIG. 4B is a schematic diagram, showing the manufacturing method of the light-cured anti-slip structure of a shoe sole of the another embodiment according to the present invention.

As illustrated in FIG. 4A and FIG. 4B, before the step S04, applying the light-curing composite on the surface 12 of the substrate 10, a mold 40 is detachably disposed on the surface 12 of the substrate 10, and then to fill a plurality of holes 41 of the mold 40 which communicates with each other with the light-curing composite 20, as shown in FIG. 4A.

After that, radiates the light-curing composite 20 with the light energy LE1, LE2 with different wavelength ranges to activate the curing reaction, and then detaches the mold 40 to allow the light-curing composite 20 to be exposed outside, thereby forming the anti-slip layer 20*c* upon the substrate surface 12. In the current embodiment, the anti-slip layer 20*c* forms a connecting layer 203 and a plurality of protrusions 204 according to a distribution of the holes 41 of the mold 40 that communicate with each other. The protrusion 204 on the connecting layer 203 could present a pattern of the mold (not shown). It is worthy to mention that when the maximum thickness T3 of the anti-slip layer 20*c* is smaller than 0.3 mm, the curing process of the light-curing composite 20 could be finished by being radiated with the light energy LE at the single wavelength, as shown in FIG. 2, instead of light energy LE1, LE2 with different wavelength ranges.

In the step S04, the light-curing composite 20 is directly applied on the surface 12 of the substrate 10, so that no medium is located between the surface 12 of the substance 10 and the anti-slip layer 20*a*, 20*b*, 20*c* that is cured. In the current embodiment, the anti-slip layer 20*a*, 20*b*, 20*c* is attached to the substrate surface 12 without using adhesive, so that manufacturing cost could be reduced and the light-cured anti-slip structure could become thinner.

In the current embodiment, the light-cured anti-slip structure 1*a*, 1*b*, 1*c* could provide a great effect of anti-slip. As shown in Table 1 below, when a value of wet grip is higher, the effect of anti-slip is greater.

TABLE 1

Wet grip value of each type of shoe soles

| Types of shoe soles | Wet grip |
|---|---|
| Conventional foam soles | 0.41 |
| Foam soles with anti-slip layer | 0.5 |
| Rubber soles | 0.55 |
| Rubber soles having better wet grip | 0.7 |

A plurality of the embodiments according to the present invention and comparative examples are listed below. The comparison shows the light-cured anti-slip structure provided by the present invention has better wet grip.

Comparative Example 1

10 parts of full acrylate resin, 1 part of 2-phenoxy ethyl acrylate, 1 part of polyethylene glycol (600) diacrylate, 0.5 parts of 2-hydroxy-2-methylpropiophenone, and 0.2 parts of diphenyl-(2,4,6-Trimethylbenzoyl)-phosphine oxide by weight are evenly mixed and undergo a light-curing reaction to form an anti-slip structure of the comparative example 1, wherein wet grip of the anti-slip structure of the comparative example 1 is 0.22.

Comparative Example 2

10 parts of amine modified polyether acrylate, 1 part of 2-phenoxy ethyl acrylate, 1 part of polyethylene glycol (600) diacrylate, 0.5 parts of 2-hydroxy-2-methylpropiophenone, and 0.2 parts of diphenyl-(2,4,6-trimethylbenzoyl)-phosphine oxide by weight are evenly mixed and undergo a light curing reaction to form an anti-slip structure of the comparative example 2, wherein wet grip of the anti-slip structure of the comparative example 2 is 0.25.

Comparative Example 3

10 parts of modified bisphenol A epoxy diacrylate, 1 part of 2-phenoxy ethyl acrylate, 1 part of polyethylene glycol (600) diacrylate, 0.5 parts of 2-hydroxy-2-methylpropiophenone, and 0.2 parts of diphenyl-(2,4,6-trimethylbenzoyl)-phosphine oxide by weight are evenly mixed and undergo a light-curing reaction to form an anti-slip structure of the comparative example 3, wherein wet grip of the anti-slip structure of the comparative example 3 is 0.23.

Comparative Example 4

10 parts of aliphatic urethane diacrylate and 0.5 parts of 2-hydroxy-2-methylpropiophenone by weight are evenly mixed and undergo a light-curing reaction to form an anti-slip structure of the comparative example 4, wherein wet grip of the anti-slip structure of the comparative example 4 is 0.38.

Comparative Example 5

10 parts of aliphatic urethane diacrylate, 1 part of 2-phenoxy ethyl acrylate, 1 part of polyethylene glycol (600) diacrylate, 0.5 parts of ditrimethylolpropane tetraacylate, 0.5 parts of 2-hydroxy-2-methylpropiophenone, and 0.2 parts of diphenyl-(2,4,6-trimethylbenzoyl)-phosphine oxide by weight are evenly mixed and undergo a light-curing reaction to form an anti-slip structure of the comparative example 5, wherein wet grip of the anti-slip structure of the comparative example 5 is 0.36.

Embodiment 1

10 parts of aliphatic urethane diacrylate, 1 part of 2-phenoxy ethyl acrylate, 1 part of polyethylene glycol (600) diacrylate, 0.5 parts of ditrimethylolpropane tetraacylate, 0.5 parts of 2-hydroxy-2-methylpropiophenone, 0.2 parts of diphenyl-(2,4,6-trimethylbenzoyl)-phosphine oxide, 2 parts of liquid rubber (Isoprene), and 0.5 parts of benzoyl peroxide by weight are evenly mixed and undergo a light-curing reaction and a thermal curing reaction without heating additionally to form an anti-slip structure of the embodiment 1, wherein wet grip of the anti-slip structure of the embodiment 1 is 0.52.

Embodiment 2

10 parts of aliphatic urethane diacrylate, 1 part of 2-phenoxy ethyl acrylate, 1 part of polyethylene glycol (600) diacrylate, 0.5 parts of ditrimethylolpropane tetraacylate, 0.5 parts of 2-hydroxy-2-methylpropiophenone, 0.2 parts of diphenyl-(2,4,6-trimethylbenzoyl)-phosphine oxide, 4 parts of liquid rubber (Isoprene), and 0.5 parts of benzoyl peroxide by weight are evenly mixed and undergo a light-curing reaction and a thermal curing reaction without heating additionally to form an anti-slip structure of the embodiment 2, wherein wet grip of the anti-slip structure of the embodiment 2 is 0.67.

Embodiment 3

10 parts of aliphatic urethane diacrylate that could be cured by UV radiation, 1 part of 2-phenoxy ethyl acrylate, 1 part of polyethylene glycol (600) diacrylate, 0.5 parts of ditrimethylolpropane tetraacylate, 0.5 parts of 2-hydroxy-2-methylpropiophenone, 0.2 parts of diphenyl-(2,4,6-trimethylbenzoyl)-phosphine oxide, 3 parts of liquid rubber (Isoprene), and 0.5 parts of benzoyl peroxide by weight are evenly mixed and undergo a light-curing reaction and a thermal curing reaction without heating additionally to form an anti-slip structure of the embodiment 3, wherein wet grip of the anti-slip structure of the embodiment 3 is 0.65.

Embodiment 4

10 parts of aliphatic urethane diacrylate that could be cured by UV radiation, 1 part of 2-phenoxy ethyl acrylate, 1 part of polyethylene glycol (600) diacrylate, 0.5 parts of ditrimethylolpropane tetraacylate, 0.5 parts of 2-hydroxy-2-methylpropiophenone, 0.2 parts of diphenyl-(2,4,6-trimethylbenzoyl)-phosphine oxide, 3 parts of liquid rubber (Isoprene), and 0.5 parts of benzoyl peroxide by weight are evenly mixed and undergo a light-curing reaction and a thermal curing reaction without heating additionally to form an anti-slip structure of the embodiment 4, wherein wet grip of the anti-slip structure of the embodiment 4 is 0.62.

Embodiment 5

3 parts of aliphatic urethane diacrylate, 7 parts of aliphatic urethane diacrylate that could be cured by UV radiation, 1 part of 2-phenoxy ethyl acrylate, 1 part of polyethylene glycol (600) diacrylate, 0.5 parts of ditrimethylolpropane tetraacylate, 0.5 parts of 2-hydroxy-2-methylpropiophenone, 0.2 parts of diphenyl-(2,4,6-trimethylbenzoyl)-phosphine oxide, 3 parts of liquid rubber (Isoprene), and 0.5 parts of benzoyl peroxide by weight are evenly mixed and undergo a light-curing reaction and a thermal curing reaction without heating additionally to form an anti-slip structure of the embodiment 5, wherein wet grip of the anti-slip structure of the embodiment 5 is 0.63.

As shown in Table 2 below, comparing with the comparative examples 1 to 5, the embodiments 1 to 5 have better ability of anti-slip.

TABLE 2

Wet grips value of each of the comparative examples 1-5 and embodiments 1-5.

| | Comparative example | | | | | Embodiment | | | | |
|---|---|---|---|---|---|---|---|---|---|---|
| | 1 | 2 | 3 | 4 | 5 | 1 | 2 | 3 | 4 | 5 |
| wet grip | 0.22 | 0.25 | 0.23 | 0.38 | 0.36 | 0.52 | 0.67 | 0.65 | 0.62 | 0.63 |

Comparing the comparative examples 1-5 to the embodiment 1-5, the ability of anti-slip of the anti-slip structures of the comparative examples which are merely formed by the photo-curing process is worse, wherein the anti-slip structure of the comparative examples are ranged from 0.22 to 0.38. However, in the current embodiments 1-5 of the present invention, the liquid rubber and the thermal curing initiator are added, so that by radiating without heating additionally to induce the photo-curing reaction and the thermal curing reaction, ability of anti-slip of the anti-slip structure is significantly enhanced, wherein the wet grip of the anti-slip structure of the embodiments are ranged from 0.52 to 0.67. As shown in table 2, the ability of anti-slip of the anti-slip structure of the embodiment 2 is the best among the five embodiments, wherein the wet grip of the anti-slip structure of the embodiment 2 is 0.67. The content of the liquid rubber of the light-curing composite of the embodiment 2 is the highest among the five embodiments. Therefore, the content of the liquid rubber of the light-curing composite is higher, the ability of anti-slip of the anti-slip structure is better.

With such design, the light-cured anti-slip structure includes the light-curing composite, wherein the light-curing composite includes photopolymer, photoinitiator, thermosetting polymer, and thermal curing initiator, which are mixed. By utilizing radiating step to induce the photo-curing reaction and the thermal curing reaction which is induced by the photo-curing reaction, it is feasible to apply the light-curing composite in liquid on the surface of the substrate so as to form the anti-slip product with the thin anti-slip layer. Besides, comparing with the conventional anti-slip rubber sole and the conventional anti-slip foam sole, the manufacturing time of the light-cured anti-slip structure is significantly shortened, so that the production efficiency, reliability, and durability could be improved. The anti-slip layer, which is formed by radiating the light-curing composite, is directly fixed onto the surface of the substrate, so that no medium or adhesive is located between the anti-slip layer and the surface of the substrate. Additionally, in the present invention, the light-curing composite undergoes the photo-curing reaction and the thermal curing reaction without an additional heating processes. In other words, after the light-curing composite is radiated by the light energy, the photo-curing reaction and the thermal curing reaction could be induced. The conventional thermosetting rubber sole needs to be cured by an additional heating processes, but the anti-slip structure of the current embodiment of the present invention does not need such processes, so that the manufacturing method of the sole with the light-cured anti-slip structure could accelerate the step of the curing process of the anti-slip layer, thereby reducing the manufacturing time, manufacturing steps, and material waste.

It must be pointed out that the embodiment described above is only a preferred embodiment of the present invention. All equivalent methods and structures which employ the concepts disclosed in this specification and the appended claims should fall within the scope of the present invention.

What is claimed is:

1. A manufacturing method of a light-cured anti-slip structure of a shoe sole, comprising:
- providing a light-curing composite, wherein the light-curing composite comprises a photopolymer, a photoinitiator, a thermosetting polymer, and a thermal curing initiator, which are mixed;
- applying the light-curing composite on a surface of a substrate; and
- providing a light energy for radiating the light-curing composite, the photoinitiator receives the light energy to induce a light-curing reaction of the photopolymer; simultaneously, the photoinitiator releases heat to activate the thermal curing initiator to induce a curing reaction of the thermosetting polymer, thereby forming an anti-slip layer on the surface of the substrate, wherein before applying the light-curing composite on the surface of the substrate, a mold is detachably disposed on the surface of the substrate, wherein the mold comprises a plurality of holes that communicate with each other; then, fill a plurality of holes of the mold with the light-curing composite, and radiate the light-curing composite with the light energy to activate the curing reaction; after that, detach the mold from the surface of the substrate to form the anti-slip layer on the surface of the substrate; the anti-slip layer has a connecting layer and a plurality of protrusions which is disposed on the connecting layer, wherein a distribution of the protrusions is in accordance with a distribution of the holes of the mold.

2. The manufacturing method as claimed in claim 1, wherein the photopolymer comprises at least one type of acrylate monomers, and the photoinitiator is selected from a group of components consisting of benzophenone, phosphine oxide, quinone, titanocene, and a combination thereof; the thermosetting polymer is selected from a group of components consisting of rubber material, urethane, epoxy, and a combination thereof; the thermal curing initiator comprises peroxide.

3. The manufacturing method as claimed in claim 1, wherein the photoinitiator receives the light energy and releases heat to increase a temperature of the light-curing composite to an exothermic temperature during the light-curing reaction, and the thermal curing initiator is activated at an initiating temperature; when the exothermic temperature is greater than or equal to the initiating temperature, the thermal curing initiator is activated to induce the curing reaction of the thermosetting polymer.

4. The manufacturing method as claimed in claim 3, wherein the exothermic temperature is greater than or equal to 60 degrees Celsius, and the initiating temperature is greater than or equal to 60 degrees Celsius.

5. The manufacturing method as claimed in claim 1, wherein a wavelength range of the light energy is from 100 nm to 600 nm, and a time of irradiation with the light energy is arranged from 1 second to 60 seconds.

6. The manufacturing method as claimed in claim 1, wherein a power of the light energy is arranged from 0.1 $J/cm^2$ to 10 $J/cm^2$.

7. The manufacturing method as claimed in claim 1, wherein the anti-slip layer has a maximum thickness which is smaller than or equal to 3 mm.

8. The manufacturing method as claimed in claim 7, wherein the maximum thickness of the anti-slip layer is smaller than or equal to 0.1 mm.

9. The manufacturing method as claimed in claim 7, wherein when the maximum thickness of the anti-slip layer is greater than or equal to 0.3 mm, the anti-slip layer is defined to have an inner layer and an outer layer that is disposed on the inner layer, wherein the light energy comprises a light energy within a first wavelength range and a light energy within a second wavelength range; the first wavelength range is from 280 nm to 600 nm, and the second wavelength range is from 100 nm to 400 nm; the light energy within the first wavelength range is adapted to induce the photopolymer of the inner layer to be cured, and the light energy within the second wavelength range is adapted to induce the photopolymer of the outer layer to be cured.

* * * * *